United States Patent
Ishida et al.

(10) Patent No.: US 10,340,479 B2
(45) Date of Patent: Jul. 2, 2019

(54) ELECTROLUMINESCENCE DEVICE

(71) Applicant: Sharp Kabushiki Kaisha, Sakai, Osaka (JP)

(72) Inventors: Mamoru Ishida, Sakai (JP); Tetsuya Okamoto, Sakai (JP); Takeshi Hirase, Sakai (JP); Takashi Ochi, Sakai (JP); Tohru Senoo, Sakai (JP); Tohru Sonoda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/742,537

(22) PCT Filed: Aug. 22, 2016

(86) PCT No.: PCT/JP2016/074343
§ 371 (c)(1),
(2) Date: Jan. 8, 2018

(87) PCT Pub. No.: WO2017/033879
PCT Pub. Date: Mar. 2, 2017

(65) Prior Publication Data
US 2018/0183006 A1     Jun. 28, 2018

(30) Foreign Application Priority Data
Aug. 27, 2015  (JP) ................ 2015-168203

(51) Int. Cl.
*H01L 33/00* (2010.01)
*H01L 21/00* (2006.01)
(Continued)

(52) U.S. Cl.
CPC ...... *H01L 51/5256* (2013.01); *H01L 51/5246* (2013.01); *H01L 27/322* (2013.01); *H01L 27/3244* (2013.01); *H01L 51/5259* (2013.01)

(58) Field of Classification Search
CPC ................................................ H01L 51/5246
(Continued)

(56) References Cited

U.S. PATENT DOCUMENTS 8,253,328 B2 *  8/2012  Hayashi ............ H01L 51/5256
                                                313/512
9,450,208 B2 *  9/2016  Sato ................. H01L 51/5271
                                                257/40

(Continued)

FOREIGN PATENT DOCUMENTS

JP     2003-297550 A     10/2003
JP     2005-317476 A     11/2005
(Continued)

OTHER PUBLICATIONS

Official Communication issued in International Patent Application No. PCT/JP2016/074343, dated Oct. 18, 2016.

*Primary Examiner* — Calvin Lee
(74) *Attorney, Agent, or Firm* — Keating & Bennett, LLP

(57) ABSTRACT

In an organic EL (electroluminescence) display device including a base member, and an organic EL element disposed on the base member, the organic EL display device further includes a sealing film to seal the organic EL element. The sealing film includes two inorganic layers, and two organic layers disposed between the two inorganic layers and having infiltration rates different from each other.

19 Claims, 14 Drawing Sheets

(51) Int. Cl.
*H01L 51/52* (2006.01)
*H01L 27/32* (2006.01)

(58) Field of Classification Search
USPC .................. 438/25, 643, 653; 257/100, 790
See application file for complete search history.

(56) References Cited

U.S. PATENT DOCUMENTS

| | | | | |
|---|---|---|---|---|
| 9,472,761 | B2* | 10/2016 | Sato | H01L 51/0031 |
| 9,520,577 | B2* | 12/2016 | Sato | H01L 27/3244 |
| 9,577,014 | B2* | 2/2017 | Ishii | H01L 27/3246 |
| | | | | 438/29 |
| 9,577,213 | B2* | 2/2017 | Sato | H01L 27/3211 |
| 9,583,737 | B2* | 2/2017 | Sato | H01L 51/5271 |
| 9,608,232 | B2* | 3/2017 | Kamiya | H01L 51/5253 |
| 9,647,229 | B2* | 5/2017 | Nakazawa | G02B 5/201 |
| 9,673,419 | B2* | 6/2017 | Ohara | H01L 51/5253 |
| 9,947,894 | B2* | 4/2018 | Sonoda | H01L 51/50 |
| 9,954,045 | B2* | 4/2018 | Hirase | H01L 51/50 |
| 10,043,999 | B2* | 8/2018 | Senoo | H01L 51/0097 |
| 2005/0242720 | A1 | 11/2005 | Sano et al. | |
| 2008/0309226 | A1 | 12/2008 | Kim et al. | |
| 2010/0187986 | A1 | 7/2010 | Kajitani et al. | |
| 2011/0140164 | A1 | 6/2011 | Seo et al. | |
| 2012/0256201 | A1 | 10/2012 | Lee et al. | |
| 2014/0027739 | A1 | 1/2014 | van de Weijer et al. | |
| 2016/0204374 | A1 | 7/2016 | Sonoda et al. | |

FOREIGN PATENT DOCUMENTS

| | | |
|---|---|---|
| JP | 2007-073504 A | 3/2007 |
| JP | 2008-311205 A | 12/2008 |
| JP | 2009-037812 A | 2/2009 |
| JP | 2013-101984 A | 5/2013 |
| JP | 2014-500582 A | 1/2014 |
| WO | 2015/029608 A1 | 3/2015 |

* cited by examiner

FIG. 6
(a)
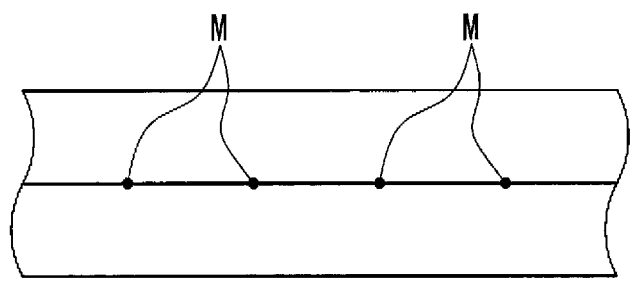
(b)
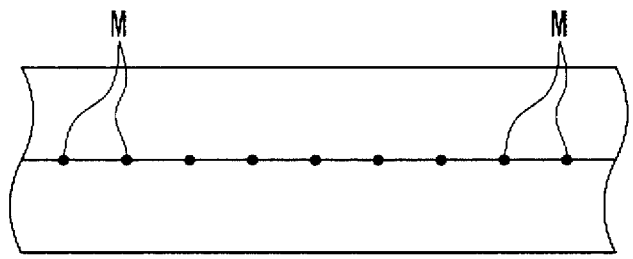

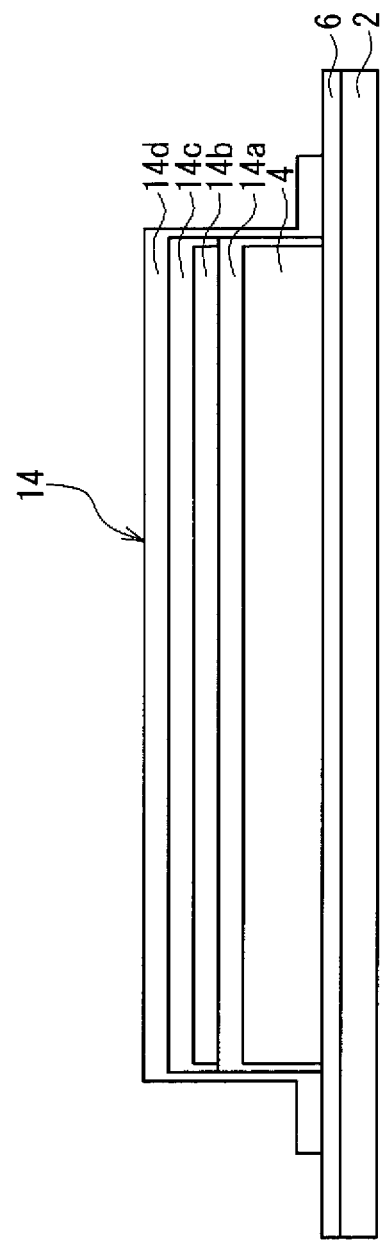

ELECTROLUMINESCENCE DEVICE

TECHNICAL FIELD

The present disclosure relates to an electroluminescence device including an EL (electroluminescence) element.

BACKGROUND ART

Recently, flat panel displays have been utilized in various commodities and fields, and those flat panel displays have been demanded to have a larger size, to provide higher image quality, and to ensure lower power consumption.

Under the situations described above, an organic EL (electroluminescence) display device including an organic EL element, which utilizes electroluminescence of an organic material, has received high attention as a flat panel display that is of all solid type, and that is superior in points of being drivable at a low voltage, having high-speed response, and being self-luminescent.

In an organic EL display device of active matrix type, for example, organic EL elements in the form of thin films are disposed on a base member including TFT's (thin film transistors). In each of the organic EL elements, organic EL layers including a light emitting layer are laminated between a pair of electrodes. One TFT is connected to one of the pair of electrodes. An image is displayed by applying a voltage between the pair of electrodes, thus causing the light emitting layer to emit light.

In the above-described organic EL display device of the related-art, a sealing film is formed over the organic EL element, as a known technique, with intent to prevent the organic EL element from deteriorating due to moisture and oxygen.

Furthermore, regarding the above-described organic EL display device of the related-art, it is proposed to form a sealing film, which includes an organic layer and an inorganic layer laminated alternately, over the organic EL element, as discussed in, for example, Patent Literature (PTL) 1 listed below. PTL 1 states that, in the organic EL display device of the related-art, deterioration of the organic EL element attributable to moisture and oxygen can be prevented with the presence of the sealing film.

CITATION LIST

Patent Literature

PTL 1: Japanese Unexamined Patent Application Publication No. 2009-37812

SUMMARY

Technical Problem

However, the above-described organic EL display device of the related-art has the following problem. Barrier properties of the sealing film degrade in some cases. In such a case, the deterioration of the organic EL (electroluminescence) element cannot be prevented, and reliability is reduced significantly.

More specifically, the above-described organic EL display device of the related-art includes not only an inorganic layer, as the sealing film, disposed in a state covering the organic EL (electroluminescence) element, but also an organic layer and an inorganic layer that are alternately and successively disposed on the above-mentioned inorganic layer.

In the above-described organic EL display device of the related-art, however, if defects, such as pinholes, are generated in the inorganic layer, barrier properties of the sealing film may degrade, and moisture, etc. may easily infiltrate through those defects and the organic layer. As a result, the organic EL element is deteriorated and reliability is significantly reduced in the above-described organic EL display device of the related-art.

In consideration of the problem described above, an object of the present disclosure is to provide an electroluminescence device which can enhance barrier properties and can ensure good reliability.

Solution to Problem

To achieve the above object, the present disclosure provides an electroluminescence device including a base member, and an electroluminescence element disposed on the base member, the electroluminescence device further including a sealing film to seal the electroluminescence element, and the sealing film includes:

two inorganic layers, and two organic layers disposed between the two inorganic layers and having infiltration rates different from each other.

According to the electroluminescence device constituted as described above, moisture can be trapped at an interface between each of the two organic layers and corresponding one of the two inorganic layers. Furthermore, moisture can be trapped in a larger amount at the interface between the organic layer having a relatively low infiltration rate and the inorganic layer than at the interface between the organic layer having a relatively high infiltration rate and the inorganic layer. As a result, it is possible to constitute the electroluminescence device with enhanced barrier properties and good reliability unlike the related art.

In the electroluminescence device described above, preferably, a difference in infiltration rate between the two organic layers takes a value within the range of 5 to 15 µm/h.

In that case, an even larger amount of moisture can be trapped at the interface between the organic layer having the relatively low infiltration rate and the inorganic layer with higher reliability, and the barrier properties can be enhanced easily.

In the electroluminescence device described above, a set of the two inorganic layers and a set of the two organic layers may be each disposed in plural sets in the sealing film.

In that case, the electroluminescence device having good barrier properties can be constituted easily.

The electroluminescence device described above may further include an opposing substrate positioned to face the base member on the side closer to the electroluminescence element, and a frame-shaped sealing member configured to encapsulate the electroluminescence element between the base member and the opposing substrate.

In that case, deterioration of the electroluminescence element can be prevented with higher reliability.

In the electroluminescence device described above, a filling material layer may be disposed in a space defined by the base member, the opposing substrate, and the sealing member.

In that case, the barrier properties with respect to the electroluminescence element can be further enhanced.

In the electroluminescence device described above, specifically in the sealing film, the inorganic layer on the side closer to the electroluminescence element and the two organic layers may be formed in the same width.

In that case, since the inorganic layer on the side closer to the electroluminescence element and the two organic layers can be formed using the same mask, a manufacturing process can be simplified.

In the electroluminescence device described above, specifically in the sealing film, the inorganic layer on the side closer to the electroluminescence element, one organic layer disposed on the inorganic layer, and the other organic layer disposed on the one organic layer may be formed in widths reducing gradually.

In that case, the electroluminescence device can be easily obtained at a lower cost in a compact size.

In the electroluminescence device described above, specifically in the sealing film including the inorganic layer on the side closer to the electroluminescence element, one organic layer disposed on the inorganic layer, and the other organic layer disposed on the one organic layer, the other organic layer may be formed in a state covering the one organic layer and contacting the inorganic layer on the side closer to the electroluminescence element.

In that case, the sealing film being robust can be obtained easily.

In the electroluminescence device described above, specifically in the sealing film, the inorganic layer on the side closer to the electroluminescence element and the other organic layer may be formed in the same width.

In that case, the sealing film being robust and manufactured in a simpler manner can be obtained easily.

In the electroluminescence device described above, specifically in the sealing film, a concave-convex portion is preferably disposed in a contact region between the inorganic layer on the side closer to the electroluminescence element and the other organic layer.

In that case, the sealing film being more robust can be obtained easily.

In the electroluminescence device described above, of the two organic layers in the sealing film, the organic layer having a relatively high infiltration rate is disposed on the side closer to the electroluminescence element, and the organic layer having a relatively low infiltration rate is disposed on the organic layer having the relatively high infiltration rate.

In that case, the interface between the organic layer having the relatively low infiltration rate and the inorganic layer is disposed at a position farther apart from the electroluminescence element, and a larger amount of moisture can be trapped at that position. Accordingly, the electroluminescence device having more enhanced barrier properties can be constituted easily.

In the electroluminescence device described above, specifically in the sealing film, the inorganic layer positioned on the outermost side is preferably disposed in a state covering the other inorganic layer and the organic layers.

In that case, the electroluminescence device can be constituted to be able to more reliably suppress infiltration of moisture, etc. from the outside.

In the electroluminescence device described above, specifically in the sealing film, the inorganic layers and the organic layers may be formed using a CVD process.

In that case, since the inorganic layers and the organic layers can be formed at relatively low temperatures, an adverse influence on the electroluminescence element can be suppressed significantly.

Advantageous Effects of Disclosure

With the present disclosure, the electroluminescence device having enhanced barrier properties and good reliability can be obtained.

BRIEF DESCRIPTION OF DRAWINGS

FIGS. 6(*a*) and 6(*b*) are enlarged views of a portion VIa and a portion VIb illustrated in FIG. 5, respectively.

FIG. 14 is an enlarged illustration referenced to explain a detailed configuration of a sealing film in an organic EL display device according to a sixth embodiment of the present invention.

DESCRIPTION OF EMBODIMENTS

Figure 1:
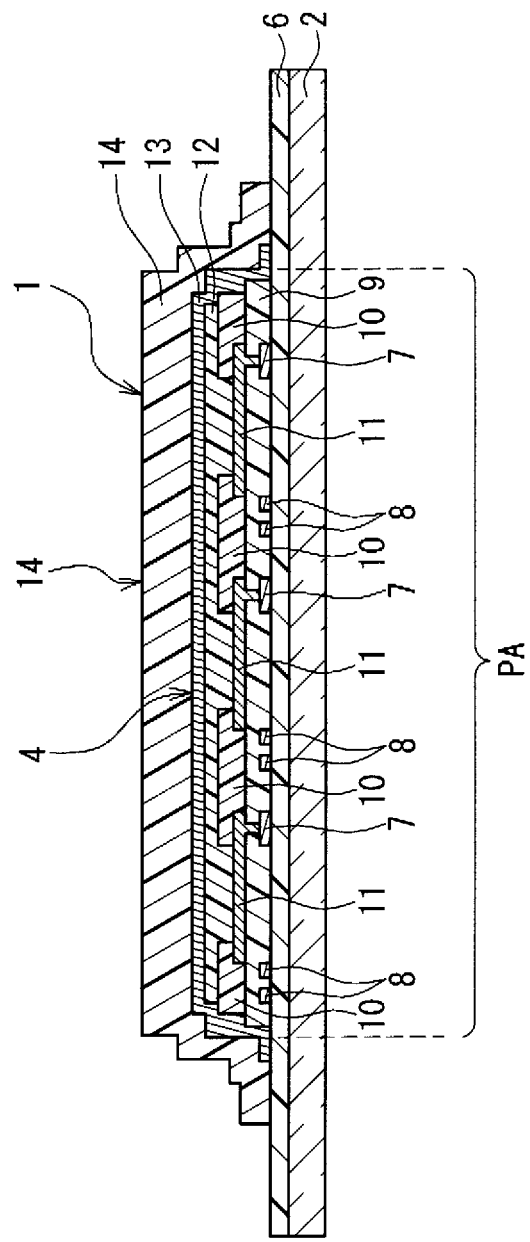
FIG. 1 is a sectional view illustrating a cross-section of an organic EL display device according to a first embodiment of the present invention.

Preferred embodiments of an electroluminescence device according to the present invention will be described below with reference to the drawings. It is to be noted that the following description is made, by way of example, in connection with the case of applying the present invention to an organic EL display device. Moreover, dimensions of individual constituent members in the drawings do not exactly represent actual dimensions of the constituent members, actual dimensional ratios among the constituent members, etc.

First Embodiment

FIG. 1 illustrates a cross-section of an organic EL display device according to a first embodiment of the present invention. Referring to FIG. 1, the organic EL display device 1 according to this embodiment includes a base member 2, and an organic EL element 4 disposed on the base member 2 and serving an electroluminescence element.

In the organic EL display device 1 according to this embodiment, the organic EL element 4 constitutes a rectangular pixel area PA including a plurality of pixels (each including a plurality of sub-pixels), and the organic EL element 4 is sealed by a sealing film 14. The pixel area PA constitutes a display section of the organic EL display device 1, and it is configured to display information. More specifically, in the pixel area PA, the plurality of pixels (each including the plurality of sub-pixels) are arranged in a matrix pattern, and the organic EL element 4 is operated to emit light per sub-pixel, thus displaying information.

In FIG. 1, the base member 2 is made of, for example, a glass material or a film having flexibility (bendability). An underlying film (insulating film) 6 is disposed on the base member 2 in a state covering an entire surface of the base member 2. As illustrated in FIG. 1, by way of example, in a light emitting region of the organic EL display device 1, TFT's (thin film transistors) 7 are disposed on the underlying film 6 for each of the sub-pixels constituting the pixel area PA. Furthermore, wirings 8 including a plurality of source lines (signal lines) and a plurality of gate lines, both the lines being arranged in the matrix pattern, are formed on the underlying film 6. A source driver and a gate driver are connected respectively to the source lines and the gate lines (though not illustrated) such that the TFT's 7 are driven per sub-pixel in accordance with an image signal applied from the outside. The TFT's 7 function as switching elements to control light emission of the corresponding sub-pixels. Thus, the TFT's 7 control the light emission from the sub-pixels each constituted by part of the organic EL element 4 and corresponding to any color of red (R), green (G), and blue (B).

The underlying film 6 is to prevent characteristics of the TFT's 7 from degrading with diffusion of impurities into the TFT's 7 from the base member 2. If it is deemed that there is no possibility of such degradation, the underlying film 6 may be omitted.

When a material having flexibility is used as the base member 2, the organic EL display device 1 can be easily constituted in a flexible form.

In addition, as illustrated in FIG. 1, an interlayer insulating film 9, an edge cover 10, and first electrodes 11 of the organic EL element 4 are formed on the base member 2. The interlayer insulating film 9 functions also as a planarizing film, and it is disposed on the underlying film 6 in a state covering the TFT's 7 and the wirings 8. The edge cover 10 is formed on the interlayer insulating film 9 in a state covering pattern end portions of the first electrodes 11. The edge cover 10 functions also as an insulating layer to prevent short-circuiting between the first electrodes 11 and a second electrode 13 described later. Furthermore, the first electrodes 11 are connected to the TFT's 7 thorough contact holes formed in the interlayer insulating film 9.

Openings formed in the edge cover 10 where the first electrodes 11 are exposed substantially constitute light emitting regions of the organic EL element 4, and each of the light emitting regions emits light in any of the RGB colors as described above. Thus, the organic EL display device 1 according to this embodiment is configured to be able to display a full-color image. Moreover, the organic EL display device 1 according to this embodiment constitutes an active matrix display device including the TFT's (thin film transistors) 7.

As illustrated in FIG. 1, an organic EL layer 12 and the second electrode 13 are formed on the first electrodes 11.

The first electrodes 11, the organic EL layer 12, and the second electrode 13 cooperatively constitute the organic EL element 4. In other words, the organic EL element 4 is a light emitting element configured to be able to emit high-brightness light with low-voltage DC drive, for example, and it includes the first electrodes 11, the organic EL layer 12, and the second electrode 13.

In more detail, when the first electrode 11 is a positive electrode, a hole injection layer, a hole transport layer, a light emitting layer, an electron transport layer, an electron injection layer, etc. are successively laminated (though not illustrated) from the side close to the first electrode 11, thus forming the organic EL layer 12. Moreover, the second electrode 13 is formed as a negative electrode. Without being limited to the above-described structure, the organic EL element 4 may be modified such that a single layer may fulfill two or more functions as represented by a layer serving as both the hole injection layer and the hole transport layer. In addition, a carrier blocking layer, for example, may be inserted as required in the organic EL layer 12.

On the other hand, when the second electrode 13 is a positive electrode, the order of the above-described individual layers laminated in the organic EL layer 12 is reversed to that in the above-described case.

When the first electrodes 11 are constituted as transmissive electrodes or semi-transmissive electrodes and the second electrode 13 is constituted as a reflective electrode, the organic EL display device 1 is the bottom emission type in which light is emitted from the side including the TFT substrate 2. Thus, in the organic EL display device 1 of the bottom emission type, surfaces of the first electrodes 11 on the side closer to the TFT substrate 2 constitute actual light emitting surfaces of the organic EL element 4, and emit the light to the outside therefrom.

Conversely, when the first electrodes 11 are constituted as reflective electrodes and the second electrode 13 is constituted as a transmissive electrode or a semi-transmissive electrode, the organic EL display device 1 is the top emission type in which light is emitted through the sealing film 14. Thus, in the organic EL display device 1 of the top emission type, surfaces of the first electrodes 11 on the side closer to the sealing film 14 constitute actual light emitting surfaces of the organic EL element 4, and emit the light to the outside therefrom.

In the organic EL display device 1 according to this embodiment, as described above, the organic EL element 4 is sealed by the sealing film 14. Thus, the sealing film 14 is configured to prevent moisture or oxygen from infiltrating (entering) the organic EL element 4 from the outside, and to prevent deterioration of the organic EL element 4.

As described in detail later, the sealing film 14 is constituted by a plurality of, e.g., two, inorganic layers and a plurality of, e.g., two, organic layers. The sealing film 14 serves to trap (capture) moisture having entered the inside thereof, and to enhance barrier properties with respect to the organic EL element 4.

The pixel area PA of the organic EL display device 1 according to this embodiment will be described in more detail below with reference to FIG. 2 as well.

Figure 2:
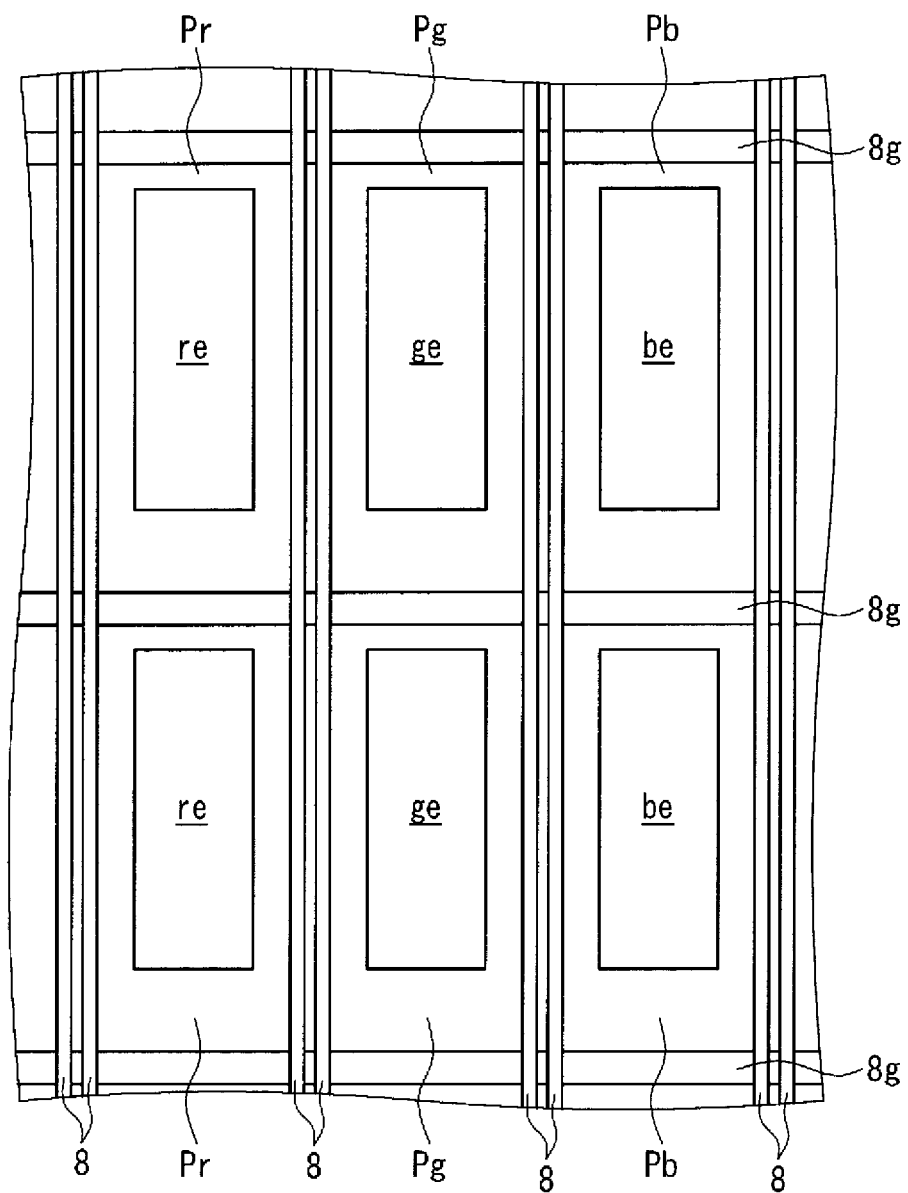
FIG. 2 is an enlarged plan view referenced to explain a pixel configuration of the organic EL display device.

FIG. 2 is an enlarged plan view referenced to explain a pixel configuration of the organic EL display device.

In the organic EL display device 1 according to this embodiment, as illustrated in FIG. 2, a red sub-pixel Pr, a green sub-pixel Pg, and a blue sub-pixel Pb (collectively called sub-pixels P hereinafter) emitting light of red (R), light of green (G), and light of blue (B), respectively, are disposed in a matrix pattern in the pixel area PA (see FIG.

1). Thus, the sub-pixels P are each demarcated by sets of two wirings 8 and individual gate lines 8g each connected to a gate of the TFT 7. More specifically, in a pixel zone of each sub-pixel P, a dimension in a left-and-right direction in FIG. 2 is given by a dimension between a center line of one set of the two wirings 8 positioned close to each other and a center line of another set of the two wirings 8 positioned adjacent to the one set of the two wirings 8, which are positioned close to each other, in the left-and-right direction in FIG. 2. Furthermore, a dimension in an up-and-down direction in FIG. 2 is given by a dimension between centers of two gate lines 8g adjacent to each other. Moreover, in each sub-pixel P, an area of the pixel zone thereof is defined by the above-described dimension in the left-and-right direction and the above-described dimension in the up-and-down direction in FIG. 2.

In the pixel area PA, one pixel is constituted by one set of the sub-pixels Pr, Pg and Pb of red, green and blue colors.

In the red sub-pixel Pr, a portion exposed at an opening re in the edge cover 10 constitutes an actual light emitting area of the red sub-pixel Pr. Similarly, in the green sub-pixel Pg, a portion exposed at an opening ge in the edge cover 10 constitutes an actual light emitting area of the green sub-pixel Pg. In the blue sub-pixel Pb, a portion exposed at an opening be in the edge cover 10 constitutes an actual light emitting area of the blue sub-pixel Pb.

The sealing film 14 will be described in more detail below with reference to FIGS. 3 to 6.

Figure 3:
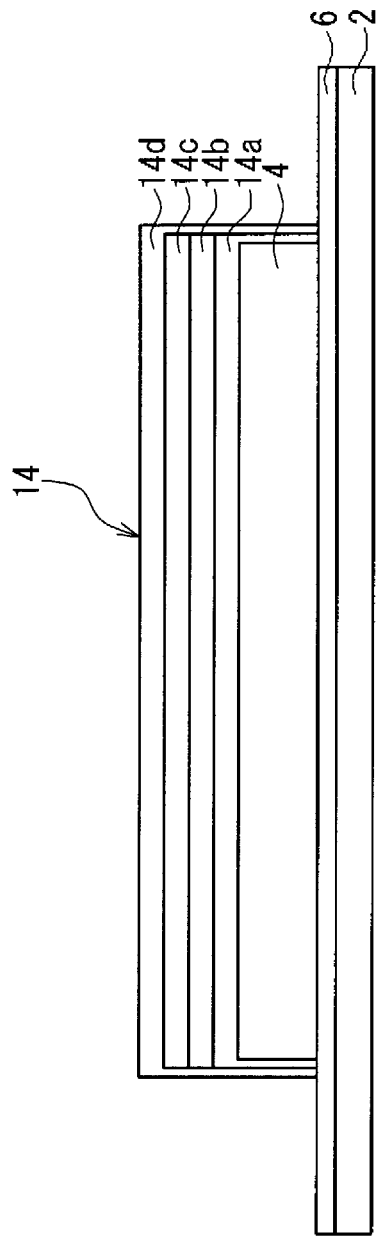
FIG. 3 is an illustration referenced to explain a detailed configuration of a sealing film illustrated in FIG. 1.
Figure 4:
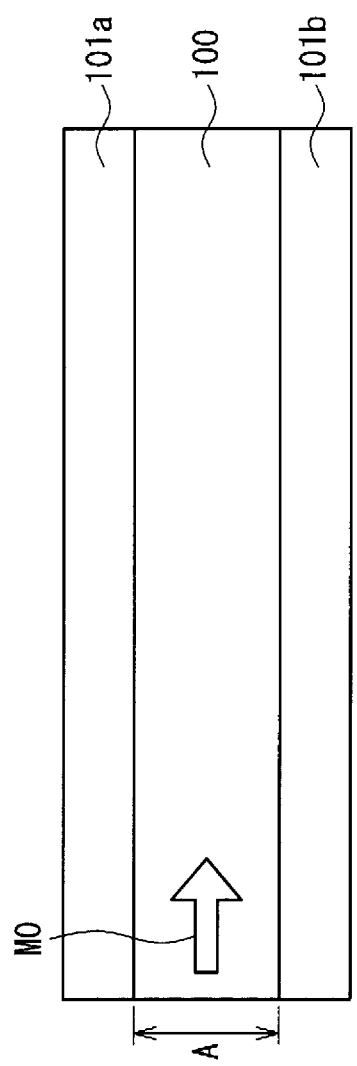
FIG. 4 is an illustration referenced to explain a method of evaluating an infiltration rate in an organic layer included in the sealing film.
Figure 5:
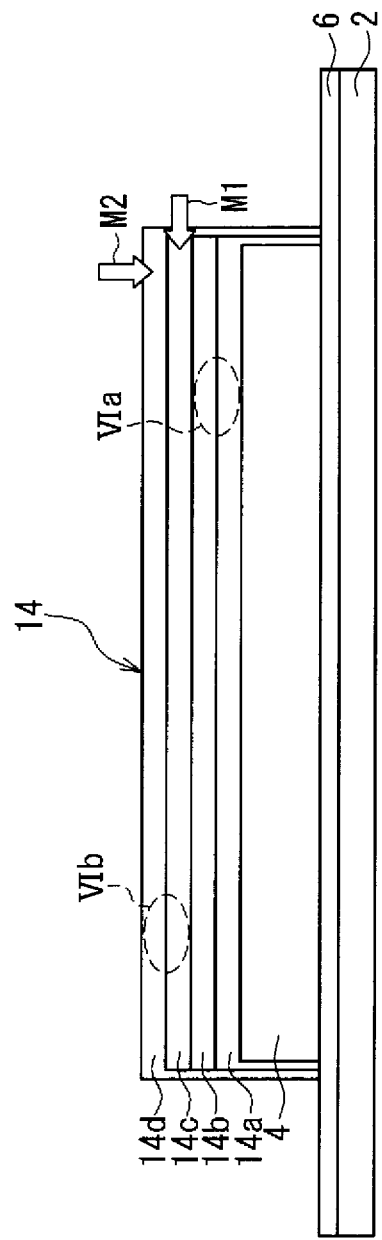
FIG. 5 is an illustration referenced to explain the function of the sealing film.

FIG. 3 is an illustration referenced to explain a detailed configuration of the sealing film illustrated in FIG. 1. FIG. 4 is an illustration referenced to explain a method of evaluating an infiltration rate in an organic layer included in the sealing film. FIG. 5 is an illustration referenced to explain the function of the sealing film. FIGS. 6(a) and 6(b) are enlarged views of a portion VIa and a portion VIb illustrated in FIG. 5, respectively.

As illustrated in FIG. 3, the sealing film 14 includes a first inorganic layer 14a disposed on the side closer to the organic EL element 4 and serving as an inorganic layer on the electroluminescence element side, and a first organic layer 14b disposed on the first inorganic layer 14a and serving as one organic layer. The sealing film 14 further includes a second organic layer 14c disposed on the first organic layer 14b and serving as the other organic layer, and a second inorganic layer 14d formed in a state covering the second organic layer 14c and serving as an outermost inorganic layer. Thus, the sealing film 14 is constituted in a multilayer structure made up of the first inorganic layer 14a, the first organic layer 14b, the second organic layer 14c, and the second inorganic layer 14d.

The first and second inorganic layers 14a and 14d are each made of, for example, silicon nitride, silicon oxide, silicon oxynitride, or aluminum oxide.

The first and second organic layers 14b and 14c are each made of, for example, organic silicon (organosilicon) such as polysiloxane or silicon oxycarbide, acrylate, polyuria, parylene, polyimide, or polyamide.

The first inorganic layer 14a, the first organic layer 14b, the second organic layer 14c, and the second inorganic layer 14d are formed by a CVD process, for example. Instead of the CVD process, a sputtering process or an ALD (Atomic Layer Deposition) process may be used, as another example, to form the first inorganic layer 14a, the first organic layer 14b, the second organic layer 14c, and the second inorganic layer 14d.

However, using the CVD process is more preferable in points that the first inorganic layer 14a, the first organic layer 14b, the second organic layer 14c, and the second inorganic layer 14d can be formed at relatively low temperatures, and that an adverse influence upon the organic EL element 4 can be suppressed significantly.

Furthermore, as illustrated in FIG. 3, the first inorganic layer 14a, the first organic layer 14b, and the second organic layer 14c are formed in the same width, for example, by employing masks having the same size, i.e., the same mask. Thus, since the first inorganic layer 14a, the first organic layer 14b, and the second organic layer 14c are formed by employing the same mask, steps of manufacturing the sealing film 14 and the organic EL display device 1 can be simplified.

In the organic EL display device 1 according to this embodiment, since the first inorganic layer 14a is disposed on the side closer to the organic EL element 4, an adverse influence of moisture upon the organic EL element 4 can be reliably prevented with the presence of the first inorganic layer 14a. Moreover, since the first organic layer 14b is disposed on the first inorganic layer 14a, reduction in the barrier properties of the sealing film 14 can be more reliably prevented for the reason as follows. Even when faults are generated due to not only stress relaxation in the first inorganic layer 14a, but also defects caused by pinholes and/or foreign matters in the first inorganic layer 14a, those faults can be recovered with the first organic layer 14b covering the first inorganic layer 14a.

In the organic EL display device 1 according to this embodiment, the second inorganic layer 14d is disposed in the state covering the first inorganic layer 14a, the first organic layer 14b, and the second organic layer 14c. According to this embodiment, therefore, the organic EL display device 1 can be constituted to be able to suppress infiltration of moisture, etc. from the outside with higher reliability.

In the organic EL display device 1 according to this embodiment, the first and second organic layers 14b and 14c are made of materials having infiltration rates different from each other. More specifically, the first organic layer 14b is made of a Si-based organic-inorganic hybrid material (e.g., SiCN) that is prepared using silane, methane, acetylene, etc. as starting materials. The second organic layer 14c is made of a Si-based organic-inorganic hybrid material that is prepared using, for example, HMDS (hexamethyldisilazane) or HMDSO (hexamethyldisiloxane) as starting materials. Thus, the first organic layer 14b on the side closer to the organic EL element 4 is constituted by an organic layer having a relatively high infiltration rate, and the second organic layer 14c on the outer side is constituted by an organic layer having a relatively low infiltration rate.

The infiltration rates in the first and second organic layers 14b and 14c, and a method of evaluating the infiltration rates will be described below with reference to FIG. 4.

The infiltration rates in the first and second organic layers 14b and 14c are evaluated as follows. As illustrated in FIG. 4, an organic layer 100 to be evaluated (i.e., the first or second organic layer 14b or 14c) is held in a state sandwiched between two inorganic layers 101a and 101b, and an infiltration rate of the organic layer 100 is determined (evaluated).

In more detail, when a sealing film illustrated in FIG. 4, i.e., a sealing film including the organic layer 100 sandwiched between the two inorganic layers 101a and 101b, is set under environmental conditions of temperature of 80° C. and humidity of 85% RH, moisture enters the inside of the sealing film from the end surface of the organic layer 100 having a cross-sectional area A (m$^2$), as denoted by an arrow "MO" in FIG. 4. The moisture having entered the sealing film comes into the deeper inside depending on an inflow amount of moisture into the sealing film.

Assuming here that the infiltration rate of moisture in a direction toward the inner side of the sealing film is V (m/h), the inflow amount of moisture per unit time is given by V×A (m³/h) using the cross-sectional area A (m²) of the organic layer 100.

Furthermore, a certain amount of the moisture having entered the inside of the organic layer 100 is accumulated at an interface between the organic layer 100 and the inorganic layer 101a and at an interface between the organic layer 100 and the inorganic layer 101b. In the above-described sealing film, therefore, an infiltration rate Vr of moisture in the direction toward the inner side of the sealing film reduces. Moreover, assuming that the amount of moisture accumulated at the above-mentioned two interfaces is represented by an apparent cross-sectional area Ai measured across the interface between the organic layer 100 and the inorganic layer 101a and the interface between the organic layer 100 and the inorganic layer 101b, the infiltration rate Vr can be determined from the following formula (1).

$$Vr = A/(A+Ai) \times V \quad (1)$$

When measuring (evaluating) the infiltration rate Vr in the above-described sealing film, the infiltration rate Vr is determined by observing the sealing film with a microscope. More specifically, the sealing film is left to stand under environmental conditions of temperature of 80° C. and humidity of 85% RH, for example, and the sealing film is observed at intervals of a certain time. Because a moisture-infiltrated portion of the organic layer 100 expands due to swelling, a film thickness of the organic layer 100 in a cross-sectional direction changes slightly. When the film thickness of the organic layer 100 is 500 to 2000 nm, for example, optical interference occurs in different modes between the swollen portion and the not-swollen portion of the organic layer 100 on the basis of a difference in refractive index between the inorganic layer 101a or 101b and the organic layer 100 in the sealing film, and hence different colors are observed between those two portions of the organic layer 100. Accordingly, an infiltration distance from the end surface of the organic layer 100 can be measured. Thus, the observed infiltration rate Vr can be obtained by measuring the infiltration distance at each observation time, and by dividing a difference between the measured infiltration distances by a difference between the observation times.

Furthermore, the film thickness, i.e., the cross-sectional area A, of the organic layer 100 is changed on condition of keeping constant a depth from the end surface of the organic layer 100, and Vr is measured for each cross-sectional area (film thickness). When an infiltration rate Vr1 at a cross-sectional area A1 and an infiltration rate Vr2 at a cross-sectional area A2 are at least determined, the cross-sectional area Ai and the infiltration rate V can be calculated using simultaneous equations that are derived by applying a set of the cross-sectional area A1 and the infiltration rate Vr1 and a set of the cross-sectional area A2 and the infiltration rate Vr2 to the above-described formula (1).

Alternatively, the infiltration rate V may be calculated by measuring the infiltration rate Vr for each of many cross-sectional areas (i.e., film thicknesses), and by carrying out fitting based on the least square method with the aid of spread sheet software, for example, to a value of the infiltration rate Vr with the cross-sectional area Ai and the infiltration rate V being variable values.

Moreover, the first and second organic layers 14b and 14c are constituted such that the difference in infiltration rate between both the layers takes a value within the range of 5 to 15 μm/h. Under such a condition, the moisture having entered the inside of the sealing film 14 can be efficiently trapped in this embodiment.

To explain in more detail, when there are defects, such as pinholes, in the second inorganic layer 14d, moisture enters the inside of the first and/or second organic layers 14b and 14c from the outside through the second inorganic layer 14d as denoted by "M1" and "M2" in FIG. 5. Thereafter, as illustrated in FIGS. 6(a) and 6(b), moisture M having entered is trapped at the interface between the first inorganic layer 14a and the first organic layer 14b and the interface between the second organic layer 14c and the second inorganic layer 14d. Here, since the second organic layer 14c is formed as an organic layer having an infiltration rate lower than that in the first organic layer 14b, an amount of the moisture M trapped at the interface between the second organic layer 14c and the second inorganic layer 14d is larger than an amount of the moisture M trapped at the interface between the first inorganic layer 14a and the first organic layer 14b, as seen from FIGS. 6(a) and 6(b).

Results of verification tests conducted by the inventors of the present invention of this application will be described in detail below.

In the verification tests, moisture impermeability of the sealing film 14 was verified on condition of changing the multilayer structure of the sealing film 14. More specifically, in the verification tests, the following test targets were prepared; namely, the sealing film of this embodiment including the first inorganic layer 14a, the first organic layer 14b, the second organic layer 14c, and the second inorganic layer 14d, and Comparative Example 1 in which the order of laminating the first and second organic layers 14b and 14c was reversed to that in the sealing film of this embodiment (i.e., a sealing film in which the second organic layer 14c having a relatively low infiltration rate was laminated on the first inorganic layer 14a, the first organic layer 14b having a relatively high infiltration rate was laminated on the second organic layer 14c, and the second inorganic layer 14d was laminated on the first organic layer 14b). In addition, Comparative Example 2 in which the first inorganic layer 14a, the second organic layer 14c, and the second inorganic layer 14d were laminated successively, and Comparative Example 3 in which the first inorganic layer 14a, the first organic layer 14b, and the second inorganic layer 14d were laminated successively were also prepared.

Thereafter, in the verification tests, moisture impermeability was evaluated by carrying out a calcium test in accordance with the calcium corrosion method on each of the sealing films of this embodiment and Comparative Examples 1 to 3, and by measuring a residual rate of calcium. In the calcium test, the sealing films of this embodiment and Comparative Examples 1 to 3 were held under the under environmental conditions of temperature of 80° C. and humidity of 85% RH, and the residual rate of calcium after the lapse of 1032 hours was determined. Table 1 lists the test results.

TABLE 1

| | Residual Rate of Calcium (%) |
|---|---|
| Embodiment | 71.3% |
| Comparative Example 1 | 66.4% |
| Comparative Example 2 | 43.2% |
| Comparative Example 3 | 20.7% |

As seen from Table 1, it was verified that the sealing film of this embodiment exhibits a maximum residual rate of calcium and has the most superior moisture impermeability.

With the above-described organic EL display device 1 according to this embodiment, the moisture M having entered the sealing film can be trapped at the interface between the first inorganic layer 14a and the first organic layer 14b and the interface between the second organic layer 14c and the second inorganic layer 14d. In addition, the moisture can be trapped in a larger amount at the interface between the second organic layer 14c having the relatively low infiltration rate and the second inorganic layer 14d than at the interface between the first organic layer 14b having the relatively high infiltration rate and the first inorganic layer 14a. As a result, this embodiment can provide, unlike the related art, the organic EL display device (electroluminescence device) 1 that can enhance the barrier properties, and that ensures good reliability.

Furthermore, according to this embodiment, the difference in infiltration rate between the first and second organic layers 14b and 14c takes a value within the range of 5 to 15 µm/h. Under such a condition, a larger amount of the moisture M can be more reliably trapped at the interface between the second organic layer 14c having the relatively low infiltration rate and the second inorganic layer 14d, and the barrier properties can be enhanced easily.

Moreover, according to this embodiment, the first organic layer 14b having the relatively high infiltration rate is disposed on the side closer to the organic EL element 4, and the second organic layer 14c having the relatively low infiltration rate is disposed on the first organic layer 14b. Thus, in this embodiment, the interface between the second organic layer 14c having the relatively low infiltration rate and the second inorganic layer 14d is disposed at a position farther away from the organic EL element 4, and the moisture M can be trapped in a larger amount at that position. Therefore, the organic EL display device 1 having even better barrier properties can be constituted easily.

Second Embodiment

Figure 7:
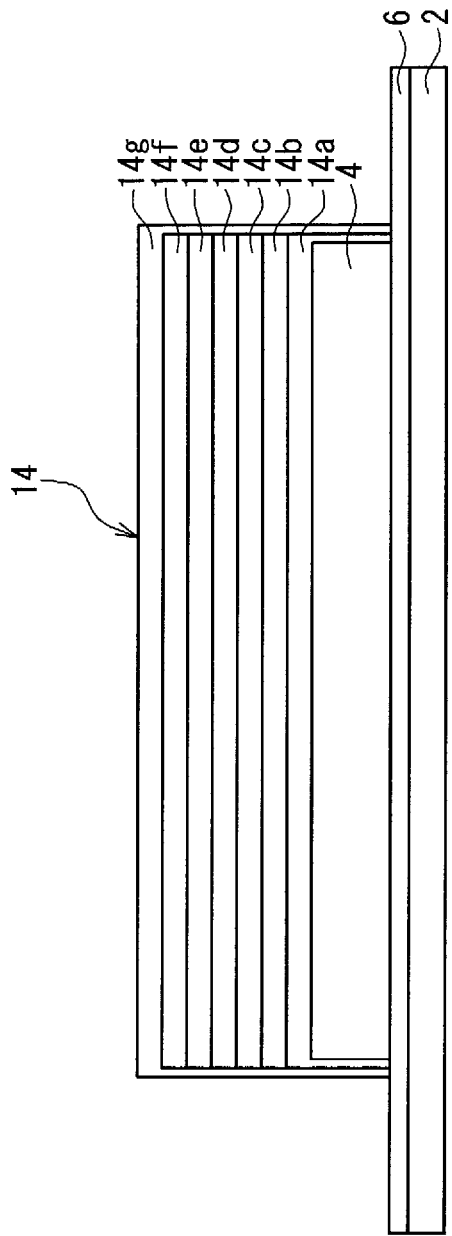
FIG. 7 is an illustration referenced to explain a detailed configuration of a sealing film in an organic EL display device according to a second embodiment of the present invention.

FIG. 7 is an illustration referenced to explain a detailed configuration of a sealing film in an organic EL display device according to a second embodiment of the present invention.

Referring to FIG. 7, a main different point between the second embodiment and the above first embodiment is that a set of two inorganic layers and a set of two organic layers are each disposed in plural sets. Elements common to those in the above first embodiment are denoted by the same reference signs, and duplicate description of those elements is omitted.

As illustrated in FIG. 7, in an organic EL display device 1 according to this embodiment, a first inorganic layer 14a is disposed in a state covering an organic EL element 4, while a first organic layer 14b, a second organic layer 14c, a second inorganic layer 14d, a third organic layer 14e, and a fourth organic layer 14f are disposed on and above the first inorganic layer 14a. The first inorganic layer 14a, the first organic layer 14b, the second organic layer 14c, the second inorganic layer 14d, the third organic layer 14e, and the fourth organic layer 14f are all formed in the same width.

Furthermore, in the organic EL display device 1 according to this embodiment, a third inorganic layer 14g is disposed as an outermost inorganic layer in a state covering the first inorganic layer 14a, the first organic layer 14b, the second organic layer 14c, the second inorganic layer 14d, the third organic layer 14e, and the fourth organic layer 14f.

In the organic EL display device 1 according to this embodiment, a set of two inorganic layers and a set of two organic layers are each disposed in two sets, for example. More specifically, the first and second organic layers 14b and 14c having infiltration rates different from each other are disposed between the first and second inorganic layers 14a and 14d, while the third and fourth organic layers 14e and 14f having infiltration rates different from each other are disposed between the second and third inorganic layers 14d and 14g.

In the organic EL display device 1 according to this embodiment, as in the first embodiment, moisture is trapped at the interface between the first inorganic layer 14a and the first organic layer 14b, the interface between the second organic layer 14c and the second inorganic layer 14d, the interface between the second inorganic layer 14d and the third organic layer 14c, and the interface between the fourth organic layer 14f and the third inorganic layer 14g.

In the organic EL display device 1 according to this embodiment, as in the first embodiment, of the first and second organic layers 14b and 14c, the second organic layer 14c positioned on the side farther away from the organic EL element 4 is formed of an organic layer having an infiltration rate lower than that in the first organic layer 14b. Therefore, moisture is trapped in a larger amount at the interface between the second organic layer 14c and the second inorganic layer 14d than at the interface between the first inorganic layer 14a and the first organic layer 14b.

Moreover, in the organic EL display device 1 according to this embodiment, of the third and fourth organic layers 14e and 14f, the fourth organic layer 14f positioned on the side farther away from the organic EL element 4 is formed of an organic layer having an infiltration rate lower than that in the third organic layer 14e. Therefore, moisture is trapped in a larger amount at the interface between the fourth organic layer 14f and the third inorganic layer 14g than at the interface between the second inorganic layer 14d and the third organic layer 14e.

With the constitution described above, this embodiment can also provide similar functions and advantageous effects to those obtained in the above first embodiment.

Furthermore, according to this embodiment, the sealing film 14 has such a structure that the first and second organic layers 14b and 14c having the infiltration rates different from each other are disposed between the first and second inorganic layers 14a and 14d, and that the third and fourth organic layers 14e and 14f having the infiltration rates different from each other are disposed between the second and third inorganic layers 14d and 14g. As a result, the organic EL display device 1 having good barrier properties can be easily constituted according to this embodiment.

Third Embodiment

Figure 8:
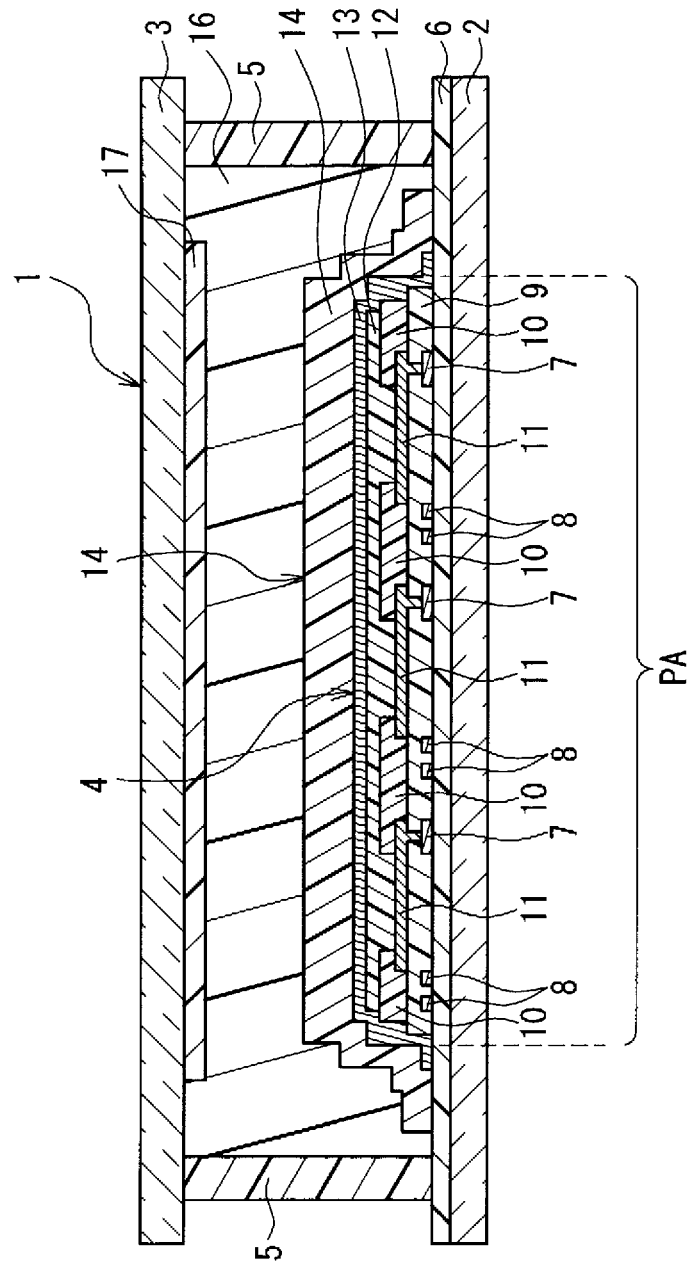
FIG. 8 is a sectional view illustrating a cross-section of an organic EL display device according to a third embodiment of the present invention.
Figure 9:
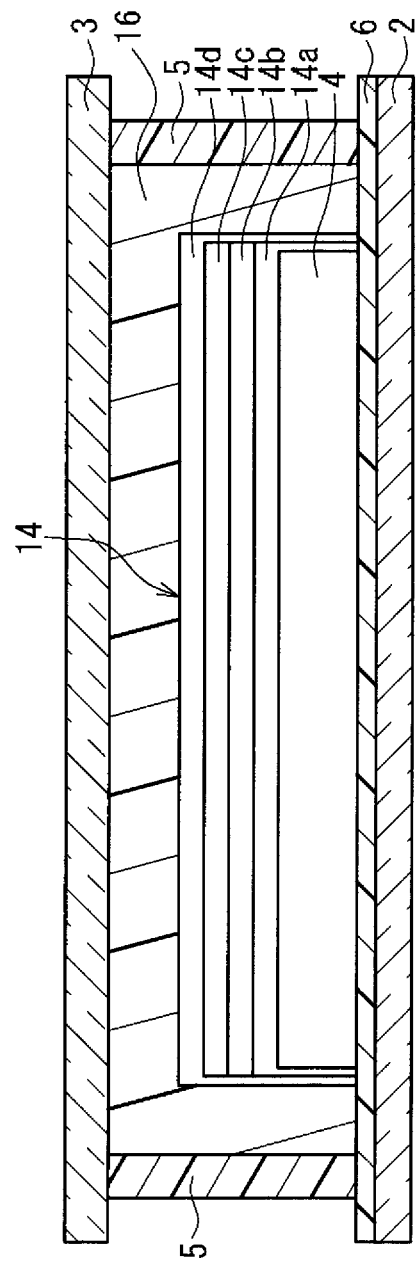
FIG. 9 is an illustration referenced to explain a detailed configuration of the sealing film illustrated in FIG. 8.

FIG. 8 is a sectional view illustrating a cross-section of an organic EL display device according to a third embodiment of the present invention. FIG. 9 is an illustration referenced to explain a detailed configuration of the sealing film illustrated in FIG. 8.

Referring to those drawings, a main different point between the third embodiment and the above first embodiment is that the third embodiment includes an opposing substrate positioned to face the base member, and a frame-shaped sealing member configured to encapsulate the organic EL element between the base member and the opposing substrate. Elements common to those in the above first embodiment are denoted by the same reference signs, and duplicate description of those elements is omitted.

As illustrated in FIG. 8, in an organic EL display device 1 according to this embodiment, an organic EL element 4 is surrounded for encapsulation by a base member 2, an opposing substrate 3 positioned to face the base member 2, and a frame-shaped sealing member 5 disposed between the base member 2 and the opposing substrate 3.

Similarly to the base member 2, the opposing substrate 3 is made of, for example, a glass material or a film having flexibility (bendability). In addition, a color filter 17 is disposed at a surface of the opposing substrate 3 on the side closer to the organic EL element 4 in order to improve light emission characteristics, such as light emission quality, of the above-described sub-pixels of RGB.

The sealing member 5 is constituted, for example, by dispersing not only a spacer that specifies a cell gap between the base member 2 and the opposing substrate 3, but also inorganic particles into in resin such as an epoxy resin. The sealing member 5 is formed in the shape of a frame surrounding the pixel area PA. The sealing member 5 can further reduce moisture permeability with the inorganic particles dispersed therein.

Furthermore, in the organic EL display device 1 according to this embodiment, a filling material layer 16 is disposed in a space, which is defined by the base member 2, the opposing substrate 3, and the sealing member 5, to cover the organic EL element 4. The filling material layer 16 is formed of, for example, a mixture that is prepared by dispersing a metal oxide, such as aluminum hydroxide or calcium oxide, or activated coal into resin.

In the organic EL display device 1 according to this embodiment, as illustrated in FIG. 8, the organic EL element 4 held in a state sealed by a sealing film 14 is surrounded by the base member 2, the opposing substrate 3, and the sealing member 5, and is further encapsulated in the space filled with the filling material layer 16.

With the constitution described above, this embodiment can also provide similar functions and advantageous effects to those obtained in the above first embodiment.

Moreover, this embodiment includes the opposing substrate 3 disposed on the side closer to the organic EL element 4 and positioned to face the base member 2, and the frame-shaped sealing member 5 disposed between the base member 2 and the opposing substrate 3 and configured to encapsulate the organic EL element 4. According to this embodiment, therefore, deterioration of the organic EL element 4 can be prevented reliably.

In addition, according to this embodiment, since the filling material layer 16 is disposed in the space defined by the base member 2, the opposing substrate 3, and the sealing member 5, the barrier properties with respect to the organic EL element 4 can be further enhanced.

Fourth Embodiment

Figure 10:
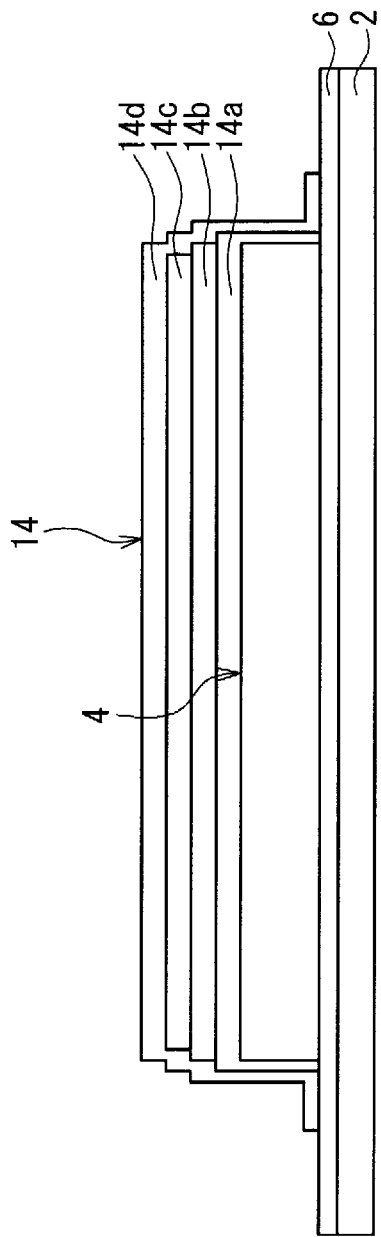
FIG. 10 is an illustration referenced to explain a detailed configuration of a sealing film in an organic EL display device according to a fourth embodiment of the present invention.

FIG. 10 is an illustration referenced to explain a detailed configuration of a sealing film in an organic EL display device according to a fourth embodiment of the present invention.

Referring to FIG. 10, a main different point between the fourth embodiment and the above first embodiment resides in forming the first inorganic layer, the first organic layer, and the second organic layer such that respective widths of the first inorganic layer, the first organic layer, and the second organic layer reduce gradually. Elements common to those in the above first embodiment are denoted by the same reference signs, and duplicate description of those elements is omitted.

As illustrated in FIG. 10, in an organic EL display device 1 according to this embodiment, a first inorganic layer 14a is disposed in a state covering an organic EL element 4, and first and second organic layers 14b and 14c are successively laminated on the first inorganic layer 14a in the order named. Furthermore, in the organic EL display device 1 according to this embodiment, a second inorganic layer 14d is disposed in a state covering the first inorganic layer 14a, the first organic layer 14b, and the second organic layer 14c as in the first embodiment.

Moreover, in the organic EL display device 1 according to this embodiment, the first inorganic layer 14a, the first organic layer 14b, and the second organic layer 14c are formed in widths gradually reducing in the order named.

With the constitution described above, this embodiment can also provide similar functions and advantageous effects to those obtained in the above first embodiment.

In addition, according to this embodiment, in the sealing film 14, the first inorganic layer 14a on the side closer to the organic EL element 4, the first organic layer (one organic layer) 14b disposed on the first inorganic layer 14a, and the second organic layer (the other organic layer) 14c disposed on the first organic layer 14b are formed in widths reducing gradually. As a result, the organic EL display device 1 can be easily obtained at a lower cost in a compact size.

Fifth Embodiment

Figure 11:
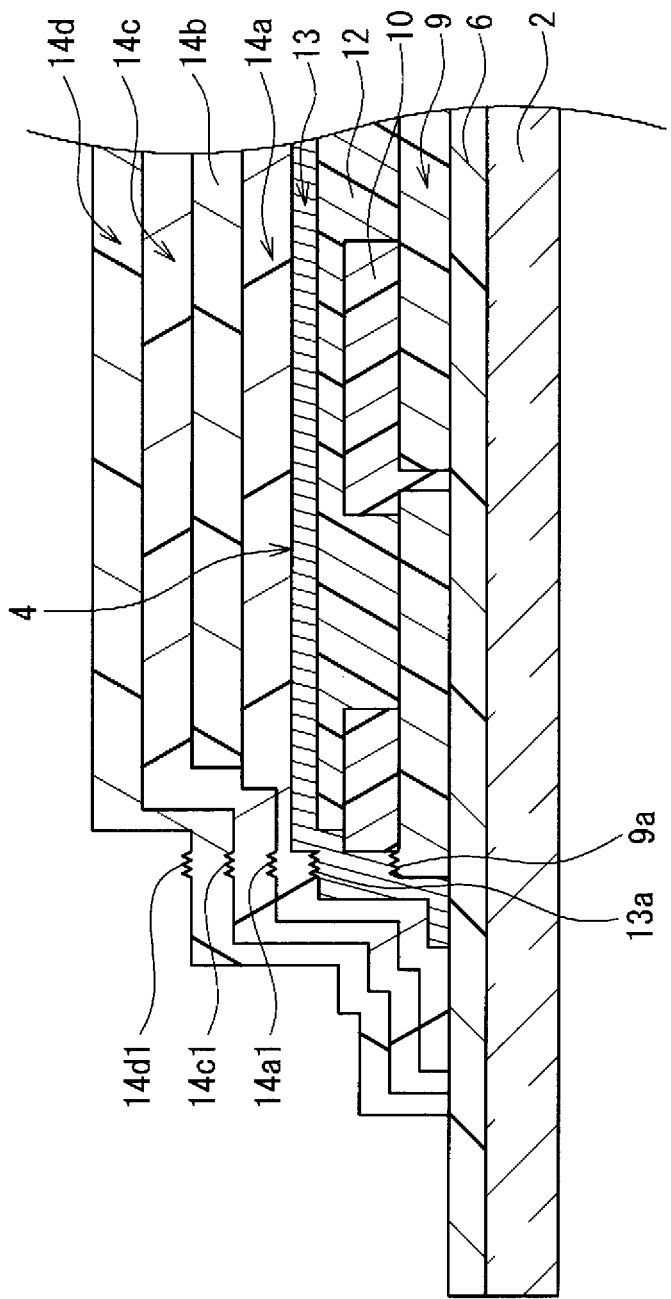
FIG. 11 is an enlarged illustration referenced to explain a detailed configuration of a sealing film in an organic EL display device according to a fifth embodiment of the present invention.
Figure 12:
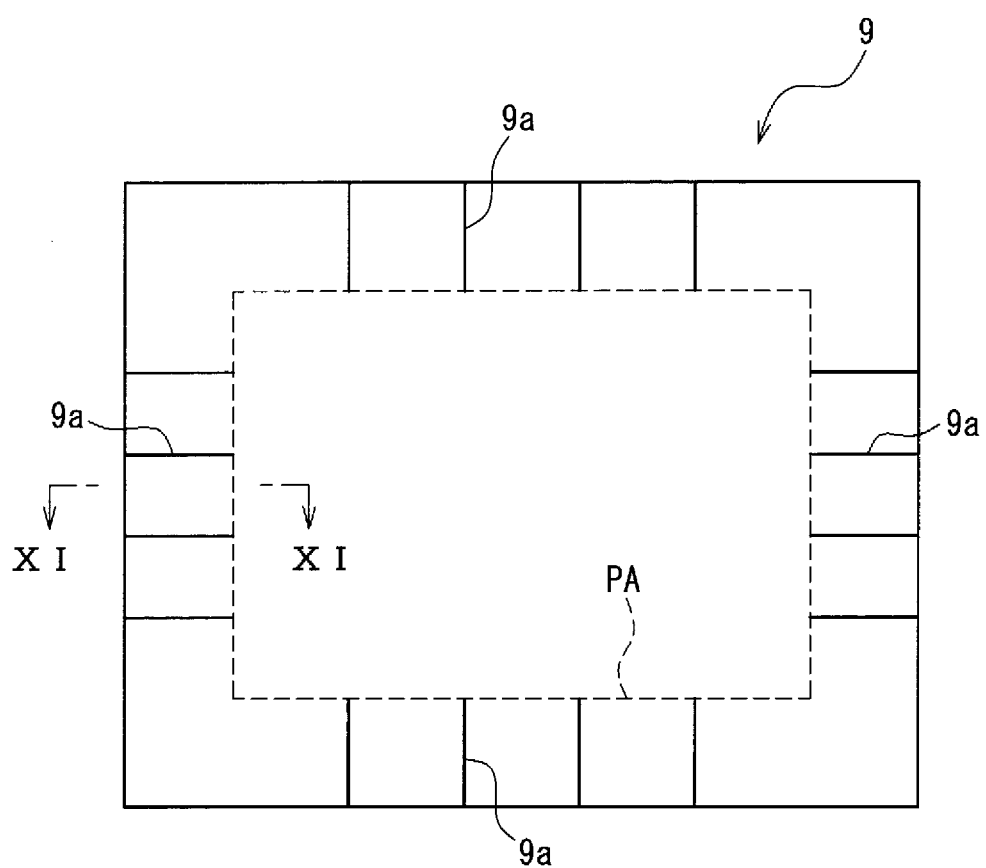
FIG. 12 is a plan view illustrating an interlayer insulating film illustrated in FIG. 11.
Figure 13:
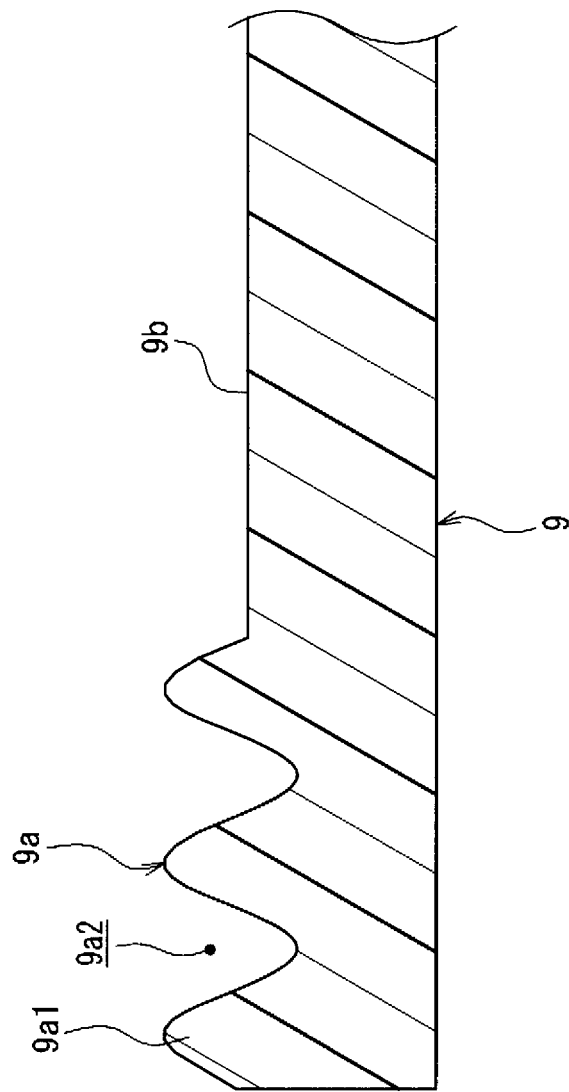
FIG. 13 is an enlarged sectional view illustrating an end portion of the interlayer insulating film.

FIG. 11 is an enlarged illustration referenced to explain a detailed configuration of a sealing film in an organic EL display device according to a fifth embodiment of the present invention. FIG. 12 is a plan view illustrating an interlayer insulating film illustrated in FIG. 11. FIG. 13 is an enlarged sectional view illustrating an end portion of the interlayer insulating film. It is to be noted that FIG. 11 illustrates, in an enlarged scale, an end portion of the entire organic EL display device along a cross-section taken along a section line denoted by XI-XI in FIG. 12.

Referring to those drawings, a main different point between the fifth embodiment and the above first embodiment is that the second organic layer is disposed in a state covering the first organic layer and contacting the first inorganic layer. Elements common to those in the above first embodiment are denoted by the same reference signs, and duplicate description of those elements is omitted.

As illustrated in FIG. 11, in an organic EL display device 1 according to this embodiment, the second organic layer 14c is disposed in a state covering the first organic layer 14b and contacting the first inorganic layer 14a.

Furthermore, in this embodiment, a concave-convex pattern is formed in a contact region between the first inorganic layer 14a and the second organic layer 14c.

More specifically, as illustrated in FIG. 12, a concave-convex portion 9a is formed in a peripheral edge of the interlayer insulating film 9, namely in a region of the interlayer insulating film 9 outside the edge cover 10. In other words, in a non-display area outside the pixel area PA surrounded by dotted lines in FIG. 12 (i.e., in an area outside an effective display area of the organic EL element 4 (effective light emission area of the electroluminescence element)), the concave-convex portion 9a is formed in the interlayer insulating film 9. The concave-convex portion 9a is formed, for example, in a manner of changing a thickness of the concave-convex portion 9a to increase and decrease in a direction perpendicular to a side of the interlayer insulating film 9, as illustrated in FIG. 12.

In more detail, as illustrated in FIG. 13, the interlayer insulating film 9 includes the concave-convex portion 9a provided in the peripheral edge of the interlayer insulating film 9, and a flat portion 9b positioned within the pixel area PA and formed to be flat. The concave-convex portion 9a includes a convex portion 9a1 having a larger thickness than the flat portion 9b and projecting from the flat portion 9b, and a concave portion 9a2 having a smaller thickness than the flat portion 9b and being recessed from the flat portion 9b. A shape of the concave-convex portion 9a is not limited to the above-mentioned example. As an alternative, the concave-convex portion 9a may be formed such that the thickness of the concave-convex portion 9a increases and decreases in a direction parallel to the side of the interlayer insulating film 9.

Furthermore, the sealing film 14 is formed to have a concave-convex pattern in its region positioned above the concave-convex portion 9a of the interlayer insulating film 9, the concave-convex pattern corresponding to the concave-convex portion 9a of the interlayer insulating film 9. In more detail, a concave-convex portion 14a1 is formed in a region of the first inorganic layer 14a above the concave-convex portion 9a to be vertically aligned with each other. A concave-convex portion 14c1 is formed in a region of the second organic layer 14c above the concave-convex portion 14a1 to be vertically aligned with each other. A concave-convex portion 14d1 is formed in a region of the second inorganic layer 14d above the concave-convex portion 14c1 to be vertically aligned with each other.

With the constitution described above, this embodiment can also provide similar functions and advantageous effects to those obtained in the above first embodiment.

Furthermore, in the sealing film 14 according to this embodiment, which has the structure made up of the first inorganic layer 14a on the side closer to the organic EL element 4, the first organic layer (one organic layer) 14b disposed on the first inorganic layer 14a, and the second organic layer (the other organic layer) 14c disposed on the first organic layer 14b, the second organic layer 14c is disposed in a state covering the first organic layer 14b and contacting the first inorganic layer 14a. As a result, a robust sealing film can be easily obtained with this embodiment.

In addition, according to this embodiment, the sealing film 14 includes the concave-convex pattern formed in the contact region between the first inorganic layer 14a and the second organic layer 14c. As a result, a more robust sealing film can be easily obtained with this embodiment.

Sixth Embodiment

FIG. 14 is an enlarged illustration referenced to explain a detailed configuration of a sealing film in an organic EL display device according to a sixth embodiment of the present invention.

Referring to FIG. 14, a main different point between the sixth embodiment and the above fifth embodiment is that the first inorganic layer and the second organic layer have the same width. Elements common to those in the above fifth embodiment are denoted by the same reference signs, and duplicate description of those elements is omitted.

As illustrated in FIG. 14, in an organic EL display device 1 according to this embodiment, the first inorganic layer 14a and the second organic layer 14c have the same width. In other words, the first inorganic layer 14a and the second organic layer 14c are formed using the same mask.

With the constitution described above, this embodiment can also provide similar functions and advantageous effects to those obtained in the above fifth embodiment.

Furthermore, according to this embodiment, since the first inorganic layer 14a and the second organic layer 14c in the sealing film 14 are formed in the same width, the sealing film 14 can be easily obtained as a robust film with a relatively simple manufacturing method.

In addition to the constitution described above, as in the fifth embodiment, the concave-convex portion 9a may be disposed in the peripheral edge of the interlayer insulating film 9, and the concave-convex portions 14a1, 14c1 and 14d1 may be disposed respectively in the first inorganic layer 14a, the second organic layer 14c, and the second inorganic layer 14d at positions above the concave-convex portion 9a.

Note that the above embodiments should be all construed to be illustrative, and not to be limitative. The technical scope of the present invention is defined by Claims, and modifications falling within scopes equivalent to the matters specified in the Claims are all included in the technical scope of the present invention.

For instance, while the above description has been made in connection with the case of employing the organic EL element as the electroluminescence element, the present invention is not limited to that case. An inorganic EL element containing an inorganic compound may be used in another case.

While the above description has been made in connection with the case of applying the present invention to the organic EL display device of active matrix type including the TFTs (thin film transistors) 7, the present invention is not limited to that case. As an alternative, the present invention may also be applied to an organic EL display device of passive matrix type not including the thin film transistors.

While the above description has been made in connection with the case of applying the present invention to the organic EL display device, the present invention is not limited to that case. The present invention may be applied to an illuminating device, such as a backlight device, in another case.

In addition to the examples described above, the above first to sixth embodiments may be combined with each other as appropriate.

INDUSTRIAL APPLICABILITY

The present invention is usefully applied to provide an electroluminescence device which can enhance the barrier properties and can ensure good reliability.

REFERENCE SIGNS LIST 1 organic EL display device
2 base member
3 opposing substrate
4 organic EL element (electroluminescence element)
5 sealing member
14 sealing film
14a first inorganic layer (inorganic layer on side closer to electroluminescence element)
14a1 concave-convex portion
14b first organic layer (one organic layer)
14c second organic layer (other organic layer)
14c1 concave-convex portion
14d second inorganic layer
14d1 concave-convex portion
14e third organic layer 14f fourth organic layer
14g third inorganic layer
16 filling material layer

The invention claimed is:

1. An electroluminescence device comprising:
a base member,
an electroluminescence element disposed on the base member, and
a sealing film to seal the electroluminescence element, wherein
the sealing film includes:
two inorganic layers, and
two organic layers disposed between the two inorganic layers,
the two organic layers are a first organic layer, and a second organic layer over the first organic layer, and
an infiltration rate of the first organic layer is higher than an infiltration rate of the second organic layer.

2. The electroluminescence device according to claim 1, wherein, in the sealing film, one of the two inorganic layers on a side closer to the electroluminescence element, the first organic layer, and the second organic layer include widths reducing gradually.

3. The electroluminescence device according to claim 1, wherein, in the sealing film, one of the two inorganic layers on a side closer to the electroluminescence element and the two organic layers have a same width.

4. The electroluminescence device according to claim 1, wherein, in the sealing film, one of the two inorganic layers that is positioned on an outermost side covers the other inorganic layer and the organic layers.

5. The electroluminescence device according to claim 1, wherein, in the sealing film, the inorganic layers and the organic layers are made of a chemical vapor deposited material.

6. The electroluminescence device according to claim 1, wherein a difference in infiltration rate between the first organic layer and the second organic layer is within a range of 5 to 15 μm/h.

7. The electroluminescence device according to claim 1, wherein a set of the two inorganic layers and a set of the two organic layers are each disposed in plural sets in the sealing film.

8. The electroluminescence device according to claim 1, further comprising:
an opposing substrate positioned to face the base member on a side closer to the electroluminescence element, and
a frame-shaped sealing member that encapsulates the electroluminescence element between the base member and the opposing substrate.

9. The electroluminescence device according to claim 8, wherein a filling material layer is disposed in a space defined by the base member, the opposing substrate, and the sealing member.

10. The electroluminescence device according to claim 1, wherein, in the sealing film including one of the two inorganic layers on a side closer to the electroluminescence element, the first organic layer, and the second organic layer cover the first organic layer and contact the inorganic layer on the side closer to the electroluminescence element.

11. The electroluminescence device according to claim 10, wherein, in the sealing film, a concave-convex portion is disposed in a contact region between the one of the two inorganic layers on the side closer to the electroluminescence element and the second organic layer.

12. The electroluminescence device according to claim 10, wherein, in the sealing film, the one of the two inorganic layers on the side closer to the electroluminescence element and the second organic layer have a same width.

13. The electroluminescence device according to claim 1, wherein
the two inorganic layers are a first inorganic layer and a second inorganic layer over the first inorganic layer,
the second organic layer covers an end portion the first organic layer and contacts the first inorganic layer, and
the second inorganic layer covers an end portion of the second organic layer.

14. The electroluminescence device according to claim 13, wherein
the first organic layer, the second organic layer, and the first inorganic layer each include a concave-convex pattern in a contact region between the first inorganic layer and the second organic layer, and
the contact region is outside of an effective display area of the electroluminescence element.

15. The electroluminescence device according to claim 14, further comprising an interlayer insulating film and an edge cover on the base member, wherein
the electroluminescence element includes first electrodes, organic electroluminescence layers, and a second electrode,
the first electrodes are defined between the interlayer insulating film and the edge cover,
a concave-convex portion is defined in a region of the interlayer insulating film outside the edge cover and defined outside an effective display area of the electroluminescence element, and
the concave-convex pattern is defined above the concave-convex portion.

16. The electroluminescence device according to claim 15, wherein a concave-convex pattern of the first inorganic layer and a concave-convex pattern of the second inorganic layer are defined above the concave-convex portion.

17. The electroluminescence device according to claim 15, wherein a thickness of the concave-convex portion changes in a direction parallel to a side of the interlayer insulating film.

18. The electroluminescence device according to claim 15, wherein a concave-convex pattern of the second electrode is defined above the concave-convex portion.

19. The electroluminescence device according to claim 15, wherein a thickness of the concave-convex portion changes in a direction perpendicular to a side of the interlayer insulating film.

* * * * *